United States Patent
Yamazaki et al.

(10) Patent No.: US 9,448,330 B2
(45) Date of Patent: Sep. 20, 2016

(54) FLUORITE

(71) Applicant: Nihon Kessho Kogaku Co., Ltd., Tatebayashi (JP)

(72) Inventors: Takafumi Yamazaki, Ageo (JP); Yusuke Shiro, Ageo (JP)

(73) Assignee: Nihon Kessho Kogaku Co., Ltd., Tatebayashi (JP)

( * ) Notice: Subject to any disclaimer, the term of this patent is extended or adjusted under 35 U.S.C. 154(b) by 502 days.

(21) Appl. No.: 14/073,900

(22) Filed: Nov. 7, 2013

(65) Prior Publication Data

US 2014/0099471 A1    Apr. 10, 2014

Related U.S. Application Data

(62) Division of application No. 13/811,352, filed as application No. PCT/JP2011/065025 on Jun. 30, 2011, now Pat. No. 8,784,970.

(30) Foreign Application Priority Data

Jul. 22, 2010    (JP) ................................ 2010-164807

(51) Int. Cl.
*G02B 1/02* (2006.01)
*C30B 29/12* (2006.01)
*G03F 7/20* (2006.01)
(Continued)

(52) U.S. Cl.
CPC ................. *G02B 1/02* (2013.01); *C01F 11/22* (2013.01); *C30B 11/04* (2013.01); *C30B 29/12* (2013.01); *G03F 1/60* (2013.01); *G03F 7/70958* (2013.01); *Y10T 428/24355* (2015.01)

(58) Field of Classification Search
CPC ........ C01F 11/22; C30B 11/04; C30B 29/12; G02B 1/02; G03F 1/60; G03F 7/70958; Y10T 428/24355
USPC ........................................................ 428/141
See application file for complete search history.

(56) References Cited

U.S. PATENT DOCUMENTS

| | | | |
|---|---|---|---|
| 3,935,302 | A | 1/1976 | Pastor et al. |
| 4,935,092 | A | 6/1990 | Morimoto et al. |

(Continued)

FOREIGN PATENT DOCUMENTS

| | | |
|---|---|---|
| EP | 1234898 A1 | 8/2002 |
| JP | 80005801 A | 1/1996 |

(Continued)

OTHER PUBLICATIONS

Tozawa, Shin'Ichiro et al., "Modification of CaF2 Optical Material", Institute for Materials Research, Tohoku University Gijutsubu Gijutsu Kenkyu Hokoku, No. 19, 2001, pp. 29-32, with English translation.

*Primary Examiner* — Maria Veronica Ewald
*Assistant Examiner* — Brian Handville
(74) *Attorney, Agent, or Firm* — The Webb Law Firm (57) ABSTRACT

A fluorite having all the more excellent laser durability compared to a conventional fluorite is provided. A fluorite is proposed, in which the standard deviation of the surface areas of the Voronoi regions in a diagram from a Voronoi decomposition of the distribution of etch-pits in the (111) plane is 6,000 μm² or less, or, in which the standard deviation of the distances of the Delaunay edges in a diagram from a Delaunay decomposition of the distribution of etch-pits of the (111) plane is 80 μm or less.

2 Claims, 10 Drawing Sheets

(51) Int. Cl.
*C01F 11/22* (2006.01)
*G03F 1/60* (2012.01)
*C30B 11/04* (2006.01)

(56) References Cited

U.S. PATENT DOCUMENTS

| | | |
|---|---|---|
| 6,146,456 A | 11/2000 | Mizugaki et al. |
| 6,878,201 B2 | 4/2005 | Oba et al. |
| 6,929,694 B2 | 8/2005 | Doguchi |
| 6,989,060 B2 | 1/2006 | Kuwabara |
| 7,033,433 B2 | 4/2006 | Li et al. |
| 7,393,409 B2 | 7/2008 | Ortmann et al. |
| 7,534,412 B2 | 5/2009 | Ortmann et al. |
| 7,837,969 B2 | 11/2010 | Staeblein et al. |
| 7,883,578 B2 | 2/2011 | Parthier et al. |
| 2006/0201412 A1 | 9/2006 | Poetisch et al. |
| 2008/0124267 A1 | 5/2008 | Yashima |

FOREIGN PATENT DOCUMENTS

| | | |
|---|---|---|
| JP | 9315815 A | 12/1997 |
| JP | 10270351 A | 10/1998 |
| JP | 11130594 A | 5/1999 |
| JP | 11240800 A | 9/1999 |
| JP | 2000211920 A | 8/2000 |
| JP | 2001041876 A | 2/2001 |
| JP | 2002255686 A | 9/2002 |
| JP | 2006248891 A | 9/2006 |
| JP | 2006342029 A | 12/2006 |
| JP | 2008156164 A | 7/2008 |
| JP | 2008156165 A | 7/2008 |

FLUORITE

CROSS-REFERENCE TO RELATED APPLICATIONS

This application is a division of U.S. patent application Ser. No. 13/811,352 filed Jan. 21, 2013, which is a national phase filing of PCT/JP2011/065025 filed Jun. 30, 2011, which claims priority to JP 2010-164807 filed Jul. 22, 2010, all of which are incorporated by reference herein in their entirety.

BACKGROUND OF THE INVENTION

1. Technical field

The present invention relates to a fluorite ($CaF_2$, calcium fluoride) that can be used, for instance, as an optical lens and a lens material used in semiconductor lithography or the like.

2. Technical background

Having special partial dispersion characteristics (: anomalous partial dispersion; Abbe number: 95) in addition to having extremely small chromatic dispersion, low refractive index and dispersion ratio compared to generic optical glasses, crystals of fluorite ($CaF_2$ crystals) are used broadly in apochromatic lenses (apochromats), window plates of infrared analyzers, excimer lasers and the like, TV camera lenses and microscope lenses, lenses of semiconductor lithography (including steppers, scanners and the like) devices, which are devices for transferring microscopic patterns onto wafers, and the like.

Among them, regarding steppers (reduction projection-type exposure devices), which assume the miniaturization process in semiconductor lithography devices, shortening of the light source wavelength has been proceeding in order to raise the resolving power, and steppers have been developed, which use for the light source an excimer laser serving as a high output laser oscillating in the ultraviolet region, and concomitantly to this, fluorite ($CaF_2$, calcium fluoride) has been drawing attention as a lens material suitable thereto. That is to say, a fluorite is characterized by the transmittance being high for light beams in a wavelength region called vacuum ultraviolet region, such as from a KrF laser (wavelength: 248 nm) or an ArF laser (wavelength: 193 nm), among the excimer laser beams.

As one factor influencing the optical characteristics of a fluorite (calcium fluoride), refractive index homogeneity, or sub-boundary, which is a portion where dislocation has accumulated, can be cited.

As conventional technique focusing on such refractive index homogeneity, using a calcium fluoride (for instance Patent Document 1) having a refractive index homogeneity of 5 ppm (that is to say, 5,000 ppb) or lower and a birefringence of 10 nm/cm or lower, or a calcium fluoride (for instance Patent Document 2) having a refractive index homogeneity of 3 ppm (that is to say, 3,000 ppb) or lower and a birefringence of 2 nm/cm or lower in the exposure optical system has been proposed.

In addition, as a novel fluorite provided with a homogeneous $CaF_2$ crystal with little strain birefringence (distortion), a fluorite is described in Patent Document 3, in which, when the light incidence plane is the (100) plane in a crystal substrate having parallel planes in the <100>direction, the mean value of the strain birefringence value per thickness at 633 nm wavelength is 0.4 nm/cm to 1.8 nm/cm, and the difference (PV) between the maximum value and the minimum value of the strain birefringence values per thickness at 633 nm wavelength is 4.0 nm/cm or less.

Meanwhile, lens materials for an excimer laser are sometimes damaged by so-called photodamages, in which a color center is formed within the material while being irradiated by a light beam such as from a laser, provoking a local change in refractive index due to a decrease in transmittance or absorption heating. Furthermore, when irradiated by a strong laser beam, not only the photodamages described above, but also destruction due to heat stress induced by absorption heating, or, damages due to insulation destruction, or the like, by the strong photoelectric field from the laser beam, are sometimes sustained, such that laser durability is one important evaluation item in this species of optical materials.

As conventional technique focused on such laser durability, for instance in Patent Document 4, a UV-compatible fluorite, in which the internal transmittance is 99.5%/cm or greater in a wavelength region of 150 nm or longer but 300 nm or shorter when irradiated with a pulsed laser beam in the ultraviolet light wavelength region for a number of pulses of $10^4$ or more but $10^7$ or less at an energy density of 1 $mJ/cm^2$/pulse or more but 50 $mJ/cm^2$/pulse or less, is described as a fluorite with excellent durability against ultraviolet light from KrF and ArF excimer lasers or the like.

In addition, in Patent Document 5, a calcium fluoride crystal, in which, after irradiating y-ray at a dose of $1 \times 10^5$ R/hour for one hour, the amount of reduction of the internal transmittance per 10 mm thickness at 260 to 280 nm wavelength is 8% or lower before irradiation, is described as a calcium fluoride crystal with excellent durability against lasers such as excimer lasers.

PRIOR ART REFERENCES

Patent Document

[Patent Document 1] Japanese Patent Application Laid-open No. H8-5801

[Patent Document 2] Japanese Patent Application Laid-open No. H10-270351

[Patent Document 3] Japanese Patent Application Laid-open No. 2008-156164

[Patent Document 4] Japanese Patent Application Laid-open No. 2001-41876

[Patent Document 5] Japanese Patent Application Laid-open No. 2000-211920

SUMMARY OF THE INVENTION

The present invention provides a novel fluorite with all the more excellent laser durability compared to a fluorite of the prior art.

The present invention provides a fluorite, in which the standard deviation of the surface areas of the Voronoi regions in a diagram from a Voronoi decomposition of the distribution of etch-pits in the (111) plane, that is to say, the standard deviation of the surface areas of the Voronoi regions (noted "Voronoi surface areas") when a Voronoi diagram has been defined (Voronoi decomposition) with each etch-pit serving as a generatrix in the distribution of etch-pits obtained by etching the (111) plane of a fluorite, is 6,000 $\mu m^2$ or less, or, a fluorite, in which the standard deviation of the distances of the Delaunay edges in a diagram from a Delaunay decomposition of the distribution of etch-pits of the (111) plane, that is to say, the standard deviation of the lengths of the Delaunay edges (noted "Delaunay distances"), in a Delaunay diagram (Delaunay decomposition) defined by joining together Delaunay points when each etch-pit serves as a Delaunay point in the distribution of etch-pits obtained by etching the (111) plane of a fluorite, is 80 µm or less, or, a fluorite satisfying both of these conditions.

In prior art, the method of evaluating etch-pit density (EPD) has been known as a technique for evaluating dislocations and crystal defects in a crystal substrate. That is to say, it is a method, in which a clean surface obtained by cleavage, or the like, of a crystal is immersed in an adequate etching solution thereby forming corroded pores (etch-pits), the crystal surface is magnified by a microscope, or the like, and the etch-pits present within this enlarged image are evaluated by being converted into counts per unit surface area.

However, when evaluating etch-pit density (EPD) in this way, there is the problem that, whether the etch-pits are present densely alined or are present uniformly dispersed, since the value is the same as far as the density is concerned, suitability of defect distribution (distribution of etch-pits) in the $CaF_2$ crystal cannot be evaluated accurately, and correlation with laser durability is not identified. In contrast, when a fluorite is evaluated as in the present invention with the standard deviation (variation) of the Voronoi surface areas or the Delaunay distances in the distribution of the etch-pits, representing the suitability of the distribution of the etch-pits more accurately becomes possible, and correlation with laser durability has also become identifiable.

Consequently, since the fluorite according to the present invention is a homogeneous fluorite, in which there are little dislocations and sub-boundary structures, and in particular having excellent laser durability, it can be used suitably as a lens material such as, for instance, TV camera lens, microscope lens, window material for infrared analysis, lens used in semiconductor lithography devices, in particular, a lens material for a stepper of an exposure apparatus, or the like, using a laser as a light source in the ultraviolet or vacuum ultraviolet wavelength region such as an ArF (argon fluoride) excimer laser exposure apparatus and an $F_2$ (fluorine) excimer laser exposure apparatus, which require optical characteristics of high degrees.

DETAILED DESCRIPTION OF THE INVENTION

Hereinafter, embodiments of the present invention will be described in detail; however, the scope of the present invention is not limited to the embodiments described below.

<The Present Fluorite>

The fluorite according to the present embodiment (hereinafter referred to as "the present fluorite") is a fluorite, in which the standard deviation of the surface areas of the Voronoi regions in a diagram from a Voronoi decomposition of the distribution of etch-pits in the (111) plane is 6,000 µm² or less, or, in which the standard deviation of the distances of the Delaunay edges in a diagram from a Delaunay decomposition of the distribution of etch-pits of the (111) plane is 80 µm or less, or, satisfying both of these conditions.

(Standard Deviation of the Voronoi Surface Areas)

The standard deviation of the surface areas of the Voronoi regions in a diagram from a Voronoi decomposition of the distribution of etch-pit in the (111) plane means the standard deviation of the surface areas of the Voronoi regions ("Voronoi surface areas") when a Voronoi diagram has been defined (Voronoi decomposition) with each etch-pit serving as a generatrix in the distribution of etch-pits obtained by etching the (111) plane of a fluorite. For the present fluorite, it is desirable that the standard deviation of the Voronoi surface areas is 6,000 µm² or less. If the standard deviation is 6,000 µm² or less, the fluorite becomes one having excellent laser durability.

From such point of view, for the standard deviation to be 4,000 µm² or less is more desirable, and in particular, to be 3,000 µm² or less is all the more desirable. Regarding the lower limit value, as there is no particular limitation, it is most preferably 0 µm²; however, realistically, 1,000 µm² or greater is desirable.

(Standard Deviation of the Delaunay Distances)

The standard deviation of the distances of the Delaunay edges in a diagram from a Delaunay decomposition of the distribution of etch-pits of the (111) plane means the standard deviation of the lengths of the Delaunay edges ("Delaunay distances") in a Delaunay diagram (Delaunay decomposition) defined by joining together Delaunay points when each etch-pit serves as a Delaunay point in the distribution of etch-pits obtained by etching the (111) plane of a fluorite. For the present fluorite, it is desirable that the standard deviation of the Delaunay distance is 80 μm or less. If the standard deviation is 80 μm or less, the fluorite becomes one having excellent laser durability.

From such point of view, for the standard deviation to be 60 μm or less is more desirable, and in particular, to be 50 μm or less is all the more desirable. Regarding the lower limit value, as there is no particular limitation, it is most preferably 0 μm; however, realistically, 30 μm or greater is desirable.

<Production Method for the Present Fluorite>

For instance, a $CaF_2$ crystal obtained by being grown via a conventionally well-known method can be heat-treated by providing a fluoride gas trap layer containing a fluoride gas-adsorbing material through compartment walls in the periphery of the fluorite crystal, thereby obtaining the present fluorite. However there is no limitation to such a production method.

A more detailed description follows.

It suffices that the crystal growth step adopts a conventionally well-known method.

For instance, $CaF_2$ raw materials in powder form, or a mixture of this and lead fluoride ($PbF_2$) serving as a scavenger, is filled into a crucible, this crucible is installed inside a crystal growth apparatus, evacuation is performed with a vacuum exhaust system until the degree of vacuum inside the crystal growth apparatus reaches on the order of $1 \times 10^{-3}$ to $10^{-4}$ Pa, and the crucible is heated with a heater to melt the raw materials filled into the crucible. Here, while gas generated by reacting impurities to fluoride with the scavenger and gas adsorbed on the inner walls of the oven and the crucible desorb concomitantly to the rise in temperature of the crucible, these are evacuated rapidly outside the system by the vacuum exhaust system of the crystal growth apparatus. After the raw materials are melted, the temperature inside the oven is maintained at a constant temperature while maintaining the desired degree of vacuum. Thereafter, when the crucible is lowered vertically downward gradually at a speed of on the order of 0.1 mm/time to 3 mm/time, the melt inside the crucible starts solidifying from near the crucible bottom portion, the crystal becomes extended and grown gradually concomitantly to the lowering of the crucible. At the stage where the entirety of the melt inside the crucible has solidified, the lowering of the crucible is terminated, and while slowly cooling with a heater, the crucible is cooled to about room temperature, allowing a $CaF_2$ crystal in ingot form to be grown.

However, there is no limitation to such a crystal growth method.

Cutting the $CaF_2$ in ingot form obtained in this way so that the surface in a given direction appears and subjecting it to the following heat-treatment step is adequate. For instance, cutting into a disk-shape of on the order of 200 mm in diameter and on the order of 40 mm in thickness and subjecting it to a heat-treatment step is adequate.

Figure 1:
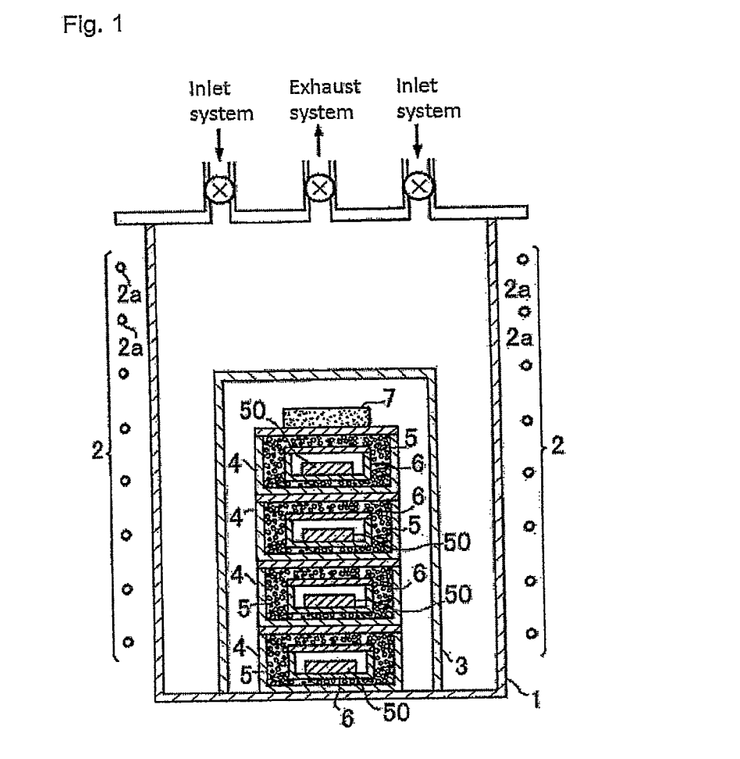
[FIG. 1] Cross-sectional view showing an example of heat-treatment oven used in the present invention.

Next, for instance as shown in FIG. 1, it is important that the $CaF_2$ crystal obtained in the crystal growth step is heat-treated by providing a fluoride gas trap layer 5 containing a fluoride gas-adsorbing material through compartment walls in the periphery of the $CaF_2$ crystal 50 to be heat-treated.

Here, the heat-treatment oven shown in FIG. 1 will be described in detail.

In FIG. 1, numeral 1 is a vacuum vessel, numeral 2 is a heater, numeral 3 is an annealing case, numeral 4 is a support vessel, numeral 5 is a fluoride gas trap layer, numeral 6 is a compartment-walled vessel, numeral 7 is a scavenger or a fluoridated agent, and numeral 50 is a $CaF_2$ crystal.

This heat-treatment oven is surrounded by a vacuum vessel 1 that may retain the interior in an airtight state, and is constituted in a way that allows the atmosphere inside the vacuum vessel 1 to be adjusted to a predetermined state as well as the temperature inside the vacuum vessel 1 to be controlled with high accuracy according to a determined temperature profile.

To adjust the atmosphere of the vacuum vessel 1 to a predetermined state, for instance, it is adequate to adjust the atmosphere by evacuating the gas inside the vacuum vessel 1 with an exhaust system and introducing a predetermined gas in suitable amounts with an inlet system.

In addition, to control the temperature of the vacuum vessel 1 with high accuracy according to a determined temperature profile, it is adequate, for instance, to install temperature sensors at suitable heights near the external walls of a support member 4 installed inside the vacuum vessel 1, for instance, at each height among an upper layer portion, a middle layer portion and a lower layer portion, and controlling with these temperature sensors and a temperature controller the temperatures of a plurality of heaters 2a, 2a . . . disposed along the side walls of the vacuum vessel 1.

The vacuum vessel 1 is formed from stainless or the like, inside of which is installed an annealing case 3.

The annealing case 3 is a vessel that fills a role for the purpose of supporting the support vessel 4 for retaining or supporting the heat-treatment subject, that is to say, the $CaF_2$ crystal, and can be formed from a carbon material. In addition, it is also a vessel that fills a role for the purpose of distributing the surrounding temperature of the support vessel 4 into an even heat.

A plurality of support vessels 4 stacked from top to bottom are housed inside this annealing case 3.

The support vessel 4 is a vessel that fills a role for the purpose of supporting the $CaF_2$ crystal, which is the heat-treatment subject, comprising, for instance, a box-shaped vessel main body comprising an opening in the upper direction and a lid body, and having a constitution allowing for stacking from top to bottom.

A respective compartment-walled vessel 6 is housed inside each support vessel 4, a respective $CaF_2$ crystal 50 is housed inside the each compartment-walled vessel 6, a fluoride gas trap layer 5 is formed between the each compartment-walled vessel 6 and the each support vessel 4.

The support vessel 4 can be formed from general carbon materials such as, for instance, extrusion-molded articles or CIP-molded articles of carbon.

The compartment-walled vessel 6 is a vessel that fills a role for the purpose of separation so that the $CaF_2$ crystal 50 does not come directly into contact with the fluoride gas trap layer 5, comprises, for instance, a box-shaped vessel main body comprising an opening in the upper direction and a lid body, and can be formed from general carbon materials such as, for instance, extrusion-molded articles or CIP-molded articles of carbon.

If the CaF$_2$ crystal 50 and the fluoride gas trap layer 5 enter into contact, not only the fluoride gas-adsorbing material adheres onto the surface of the CaF$_2$ crystal 50 during the heat-treatment, compromising the optical properties of the CaF$_2$ crystal 50, but a grain boundary structure of the crystal surface in contact also develops, compromising the optical properties; therefore, separating the two parties is important.

Figure 2:
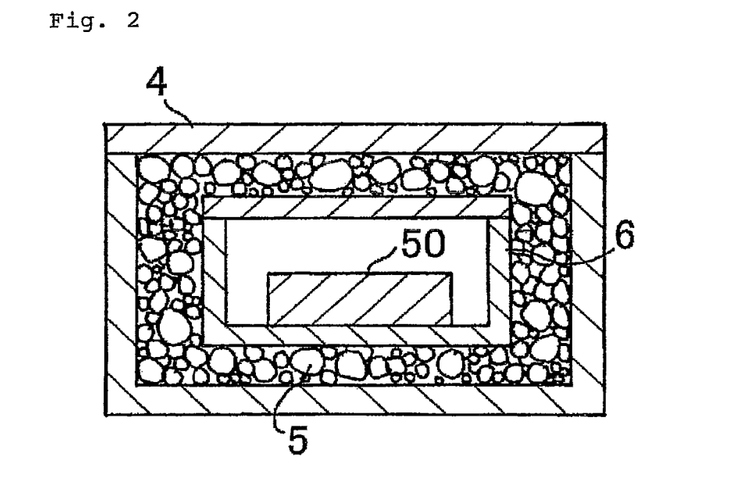
[FIG. 2] Magnified cross-sectional view of relevant portion showing each compartment-walled vessel magnified centered thereon in FIG. 1.

The fluoride gas trap layer 5 can be formed by filling the fluoride gas-adsorbing material between the compartment-walled vessel 6 and the support vessel 4, so as to surround the entire periphery of the compartment-walled vessel 6, as shown in FIG. 2.

From the point of view of chemical reactions, it is desirable that the fluoride gas-adsorbing material is a material capable of adsorbing effectively a fluoride gas of a transition metal such as Cr, Fe, Ni and Mn, and is one having a vapor pressure that is equal to or lower than that of the scavenger PbF$_2$. Among these, those whereof the vapor pressure is equal to or lower than that of CaF$_2$ are desirable. Concretely, to be powders, debris and grounds of a fluoride, for instance, powders, debris or grounds of a fluoride of Ca, or, powders, debris or ground powders of a fluoride of an element of the same family as Ca, for instance, an alkaline-earth element such as Mg, Sr or Ba, or, a mixture of two or more species thereof, is desirable. Among these, to be either of powders, debris and grounds of a fluoride of Ca, or a mixture of two or more species thereof, is more desirable.

From the point of view of gas trapping ability, the fluoride gas-adsorbing material is preferably a mixture with dispersed sizes so as to allow for fine filling.

From the point of view that a fluoride gas can be adsorbed effectively, the thickness of the fluoride gas trap layer 5 is preferably 5 mm to 200 mm, in particular 10 mm to 100 mm, of which in particular 20 mm to 50 mm is more desirable.

While it is desirable for the fluoride gas trap layer 5 to be formed so as to surround the entirety of the periphery of the compartment-walled vessel 6, it may be formed so as to surround a portion thereof.

In addition, the fluoride gas trap layer 5 may be formed into a plurality of layers.

It is adequate that the atmosphere in the heat-treatment, that is to say, the atmosphere inside the annealing case 3, is a vacuum atmosphere or an inert gas atmosphere such as of argon (Ar). Among them, inert gas atmospheres such as of argon, and among these, atmospheres comprising a fluorine gas mixed with/injected into argon gas, are desirable.

In addition, as shown in FIG. 1, housing a scavenger or a fluorinated agent inside the annealing case 3 is desirable.

It is possible to use as fluorinated agent, for instance, Teflon (registered trademark), acidic ammonium fluoride (NH$_4$F.HF) or the like, or, lead fluoride, zinc fluoride or the like, or, a substance whereof the fluorine constituent can be gasified by raising the temperature.

While this fluorinated agent is one that is used in order to prevent oxygen and moisture remaining on the surface of the CaF$_2$ crystal 50 or inside the compartment-walled vessel 6 from reacting with the CaF$_2$ crystal 50, the use is not absolutely needed.

The temperature profile in the heat-treatment step is not limited in particular. Since the melting point of calcium fluoride is on the order of 1,370° C. to 1,410° C., heating to a temperature where the CaF$_2$ crystal 50 does not dissolve and maintains the state of a solid while each atom constituting the CaF$_2$ crystal 50 is given sufficient energy to be moved to a suitable position respectively to cancel an anisotropy due to a disturbance of the crystal structure is adequate, and this temperature region is not limited in particular. As a guide, in order to cancel more effectively an anisotropy due to a disturbance of the crystal structure, raising the temperature to 1,000 to 1,350° C. is desirable.

While the rate of rise in temperature is not limited in particular, as there is the necessity of raising the temperature inside the oven so that the CaF$_2$ crystal 50 housed inside the compartment-walled vessel 6 does not generate damages such as a crack due to a thermal shock, raising the temperature for instance at 10° C./h to 200° C./h is desirable.

In so doing, first, the temperature inside the oven may be raised to a predetermined target temperature of temperature rise (temperature rise step), then performing at least twice a rise-drop cycle in which temperature dropping and temperature rising are carried out alternately in the predetermined heat-treatment temperature region (rise-drop cycle step) and thereafter transitioning to a cooling step.

In the cooling step after the heat-treatment, taking time and cooling slowly is desirable, since distortions are likely to remain inside the crystal, and in addition, sliding defects are introduced, increasing dislocation or the like, if cooling rapidly. On the other hand, productivity is noticeably lost if too much time is spent. From such points of view, in the cooling step after the heat-treatment, cooling to near room temperature at a cooling rate of, for instance, 0.1 to 5° C./h, and in particular 0.5 to 1.5° C./h, is desirable.

Then, finally, it suffices that the CaF$_2$ crystal 50 after heat-treatment is cut and processed as necessary into a suitable shape. For instance, processing into a shape having as a surface a plane that is parallel to the (111) plane is sufficient. As a more concrete example, the method of cutting a CaF$_2$ crystal 50 presenting a disk shape into a shape having a surface that is parallel to the (111) plane, further surface-grinding the surface for the purpose of smoothing the surface can be cited.

<Applications>

Since the present fluorite is a homogeneous fluorite, in which there are little dislocations and sub-boundary structures, and in particular having excellent laser durability, it can be used as, for instance, an apochromatic lens (apochromat), a TV camera lens, a microscope lens, a window material for infrared analysis, a lens used in semiconductor lithography (stepper and scanner) devices, or other optical lens. In particular, since a fluorite in which the homogeneity of the crystal is macroscopically high, and having excellent laser durability can be obtained, it can be used suitably as a lens material for a high precision stepper, that is to say, a stepper of an exposure apparatus, or the like, using laser as a light source in the ultraviolet or the vacuum ultraviolet wavelength region such as an ArF (argon fluoride) excimer laser. In addition, having excellent laser durability, the present fluorite can be used suitably as a window material of a laser beam source of ultraviolet or vacuum ultraviolet wavelength region such as of an ArF excimer laser, or an optical element such as of a resonator mirror.

<Explanation of the Terms>

In the present invention, when "X to Y" (X and Y are any numbers) is stated, unless specified otherwise, it is to include the meaning of "X or greater but Y or less" along with the meaning of "preferably larger than X" or "preferably smaller than Y".

In addition, when "X or greater" (X is any number) is stated, unless specified otherwise, it is to include the meaning of "preferably larger than X", and when "Y or less" (Y is any number) is stated, unless specified otherwise, it is to include the meaning of "preferably smaller than Y".

EXAMPLES

Hereinafter, examples and comparative examples according to the present invention will be described. However, the present invention is not limited to the contents described below.

First, evaluation methods for the obtained fluorite will be described.

<Evaluation Method For Laser Durability>

Regarding the laser durability measured as a decrease in transmittance when irradiating ArF excimer laser onto a fluorite, in the present invention, it was decided to evaluate the laser durability by observing the decrease in transmittance induced when irradiating a radiation from a higher energy radiation source, that is to say, the absorption of the induced color center.

Consequently, in the present invention, γ-rays (1.17 MeV and 1.33 MeV) emitted from the radioisotope $^{60}$Co was irradiated in predetermined doses onto a radiation source, the color center induced at that moment inside the crystal was measured with a spectrophotometer to obtain an induced color center absorption spectrum. A negative correlation is known to exist for the relationship between laser durability and γ-ray-induced color center absorption intensity. That is to say, in a crystal with high laser durability, the γ-ray-induced color center absorption intensity is small. The laser durability of the present fluorite can be evaluated from this correlation relationship.

Concretely, both end faces of a fluorite sample were optical polished so that the planes became parallel, and the optical length (sample thickness) was set to be 30 mm. Such a fluorite sample was retained inside a dark box, and a dose of 5.4 kGy γ-ray (1.33 MeV) from 60Co was irradiated in air to induce a color center in the sample. Next, after irradiation, a recording spectrophotometer (U-4100, Hitachi High Technologies) was used rapidly to measure the absorption spectrum of this fluorite sample in the UV-visible wavelength region (200 nm to 800 nm).

By "absorption" here, the so-called absorption coefficient (value obtained by taking the natural logarithm of transmittance corrected for the reflections of the end faces and normalizing with the length according to the Lambert-Beer's Law; the unit is $cm^{-1}$) was adopted.

In addition, in order to quantify the induced color center absorption intensity, the value obtained by integrating the obtained absorption spectrum in an interval from 200 nm to 800 nm wavelength was used. This integration value is defined as the γ-ray-induced color center intensity. That is to say, if the laser durability is low (high), the induced absorption spectrum integration value becomes large (small).

<Evaluation Method For Etch-Pits>

In the present example, with respect to the etch-pit distribution in the $CaF_2$ crystal, the Voronoi surface areas and the Delaunay distances described below were defined, the variations (standard deviations) thereof were calculated, whereby the dislocation distribution (etch-pit distribution) in the $CaF_2$ crystal was quantitatively evaluated.

(Calculation methods for the standard deviations of Voronoi surface areas and Delaunay distances)

1) In order to obtain a clean surface of $CaF_2$ crystal, it was cleaved or precision polished in the (111) plane.

Here, the reason for having the $CaF_2$ (111) plane as the etching surface is that a flat surface (that is to say a surface of cleavage) can be obtained easily. In addition, the obtained etch-pit is characterized by the fact that a pit with a trigonal pyramidal shape constituted by other (111) planes is obtained.

2) Etching of 25° C.×1 hour was performed by immersion in an etchant (7% HCl solution).

3) The etched surface (4 mm in four directions) was photographed with a light microscope, and the image was digitized.

4) Based on the etch-pit image digitized in this way, the etch-pits and portions other than these were processed by binarization (Background removal, threshold value setting). In addition, dust and scratches other than the etch-pits were eliminated. In addition, adjacent, overlapping etch-pits were separated manually and by watershed segmentation.

5) If etch-pits were regularly arranged and adjacent in sub-boundaries or grain boundaries and there were overlaps, each etch-pit was separated based on an average neighboring distance. Concretely, the separation was done by generating a mesh (Grid) against an etch-pit group that had been binarized and recognized as a line.

6) For the etch-pit images adjusted in this way (refer to FIG. 7, FIG. 10, FIG. 13 and FIG. 16), Delaunay decomposition and Voronoi decomposition were performed using an image processing soft (freeware: ImageJ). That is to say, for the entirety of the etch-pits within the effective field of view, the center-of-gravity point thereof was determined and served as a generatrix, and with respect to the entirety of the generatrixes in the image, domain-separation (Voronoi decomposition) was carried out depending on which generatrixes the other generatrixes were close to and it is served as a Voronoi diagram (refer to FIG. 9, FIG. 12, FIG. 15 and FIG. 18), each polygonal-shape region that constitutes the Voronoi diagram is served as a Voronoi region and the border line separating each region is served as a Voronoi boundary. In addition, a diagram decomposed newly by linking together the entirety of the generatrixes (these are referred to as a "Delaunay point") contained in two Voronoi regions that are adjacent through the Voronoi boundary, served as a Delaunay diagram (or, Delaunay diagram; refer to FIG. 8, FIG. 11, FIG. 14 and FIG. 17).

Next, the surface area of a Voronoi region (Voronoi figure) in the Voronoi diagram within the effective field of view was defined and calculated as "Voronoi surface area", and the standard deviation was calculated by carrying out statistical processing to evaluate the variation in the Voronoi surface area.

In addition, the lengths of the edges of each figure (defined as the "Dealunay distances") in the Delaunay diagram (Dealunay decomposition) were calculated and the standard deviation of the Delaunay distances was determined by carrying out statistical processing to evaluate the variation.

Figure 3:
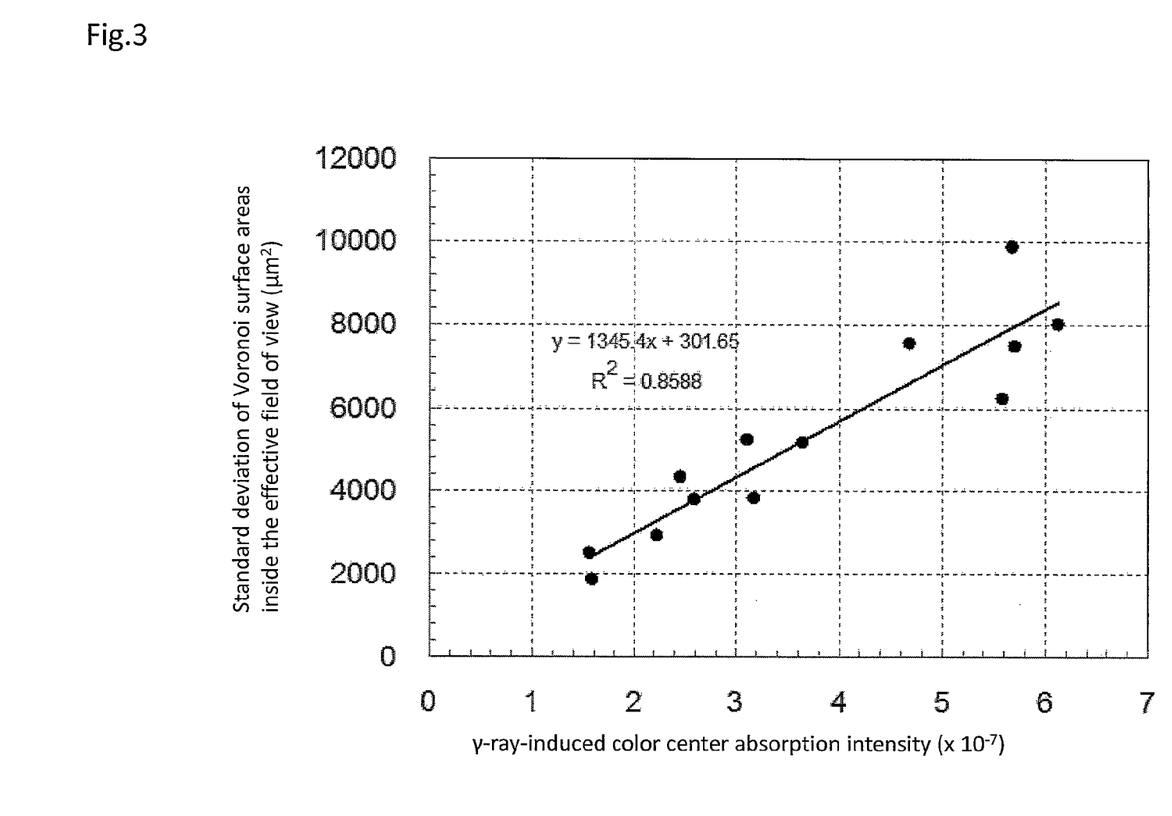
[FIG. 3] Graph showing the relationship between the color center absorption intensity induced by γ-ray irradiation, which is an alternative property to laser durability, and the standard deviation of Voronoi surface areas for the samples obtained in Examples 1 to 8 and Comparative Examples 1 to 5.
Figure 4:
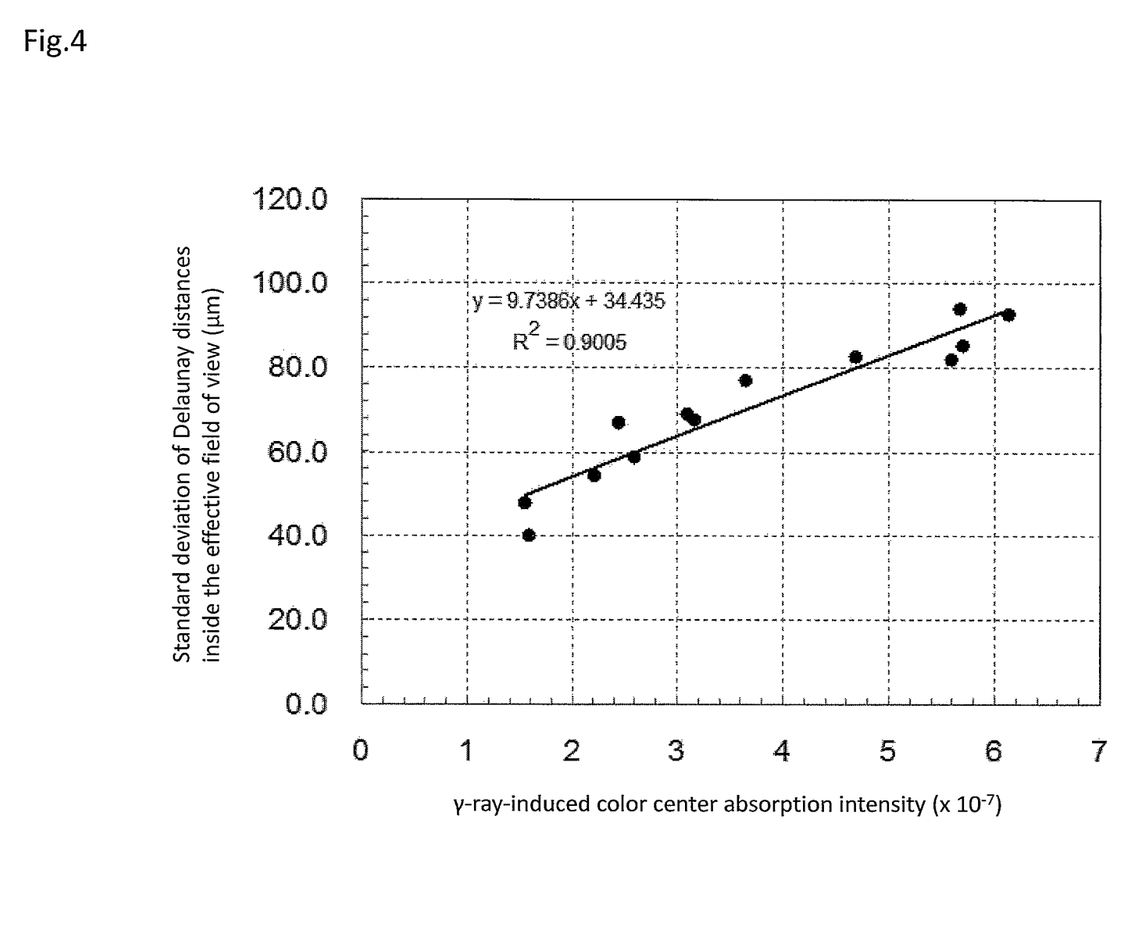
[FIG. 4] Graph showing the relationship between the color center absorption intensity induced by γ-ray irradiation, which is an alternative property to laser durability, and the standard deviation of Delaunay distances for the samples obtained in Examples 1 to 8 and Comparative Examples 1 to 5.
Figure 5:
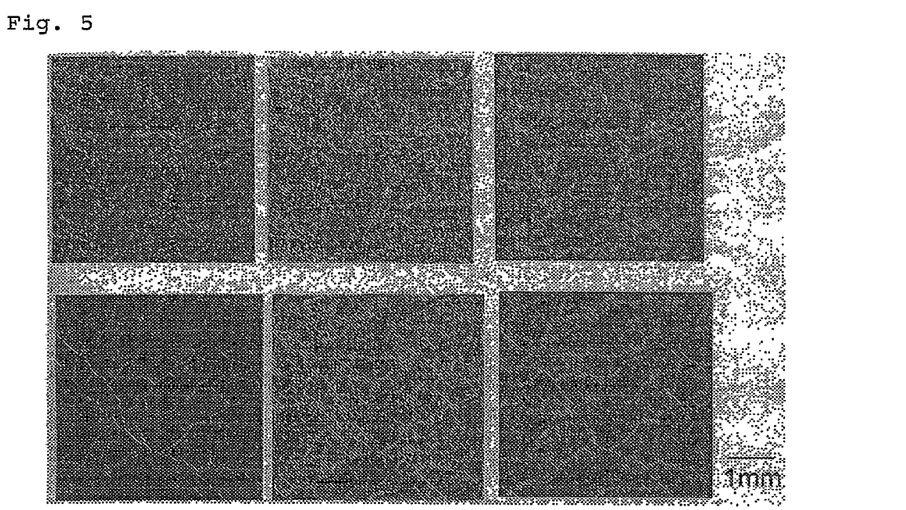
[FIG. 5] View comparing the etch-pit images (Etch-pit observation images), the Delaunay diagrams and the Voronoi diagrams of the samples obtained in Example 1 and Comparative Example 1 aligned at the top and the bottom respectively.
Figure 6:
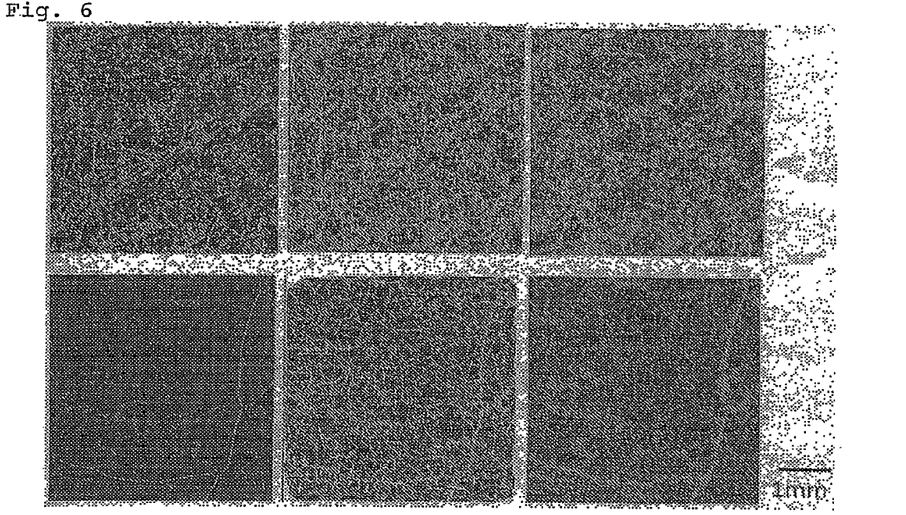
[FIG. 6] View comparing the etch-pit images (Etch-pit observation images), the Delaunay diagrams and the Voronoi diagrams of the samples obtained in Example 2 and Comparative Example 2 aligned at the top and the bottom respectively.
Figure 7:
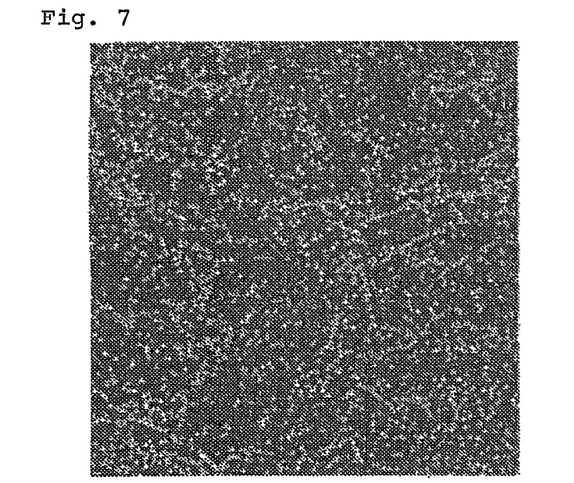
[FIG. 7] Etch-pit image (Etch-pit observation image) of the sample obtained in Example 1.
Figure 8:
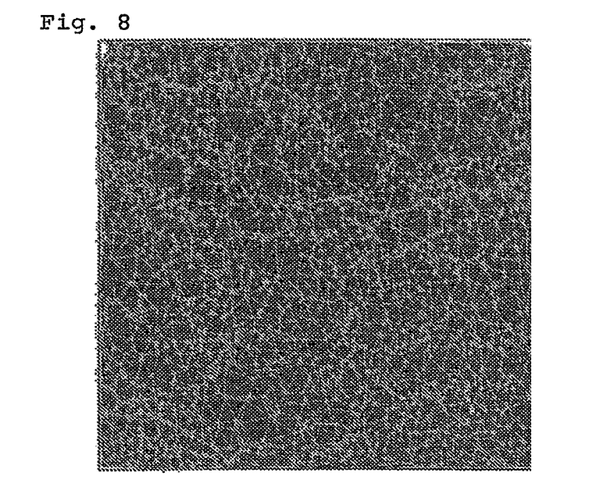
[FIG. 8] Delaunay diagram of the sample obtained in Example 1.
Figure 9:
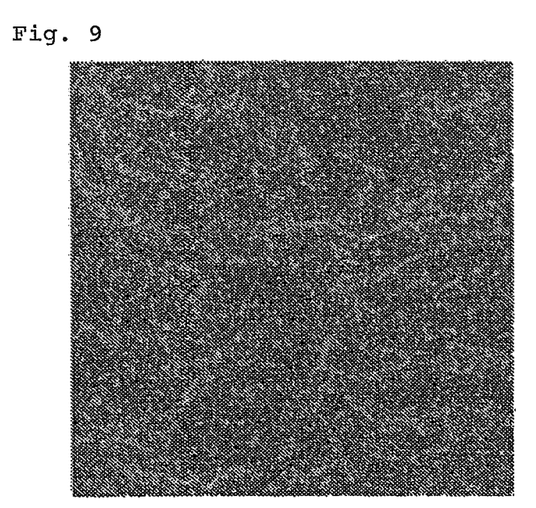
[FIG. 9] Voronoi diagram of the sample obtained in Example 1.
Figure 10:
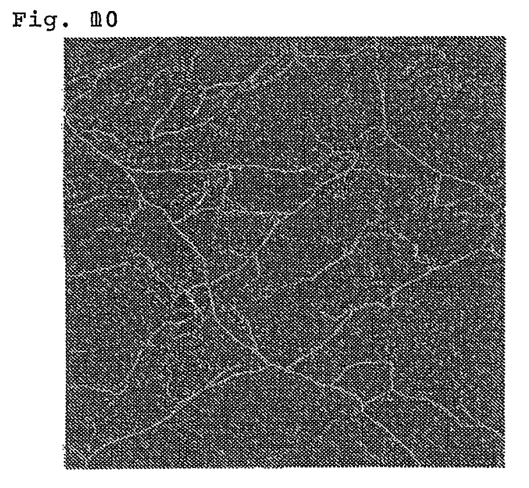
[FIG. 10] Etch-pit image (Etch-pit observation image) of the sample obtained in Comparative Example 1.
Figure 11:
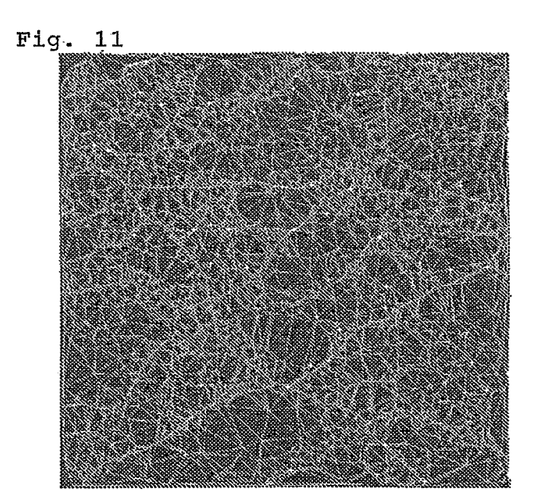
[FIG. 11] Delaunay diagram of the sample obtained in Comparative Example 1.
Figure 12:
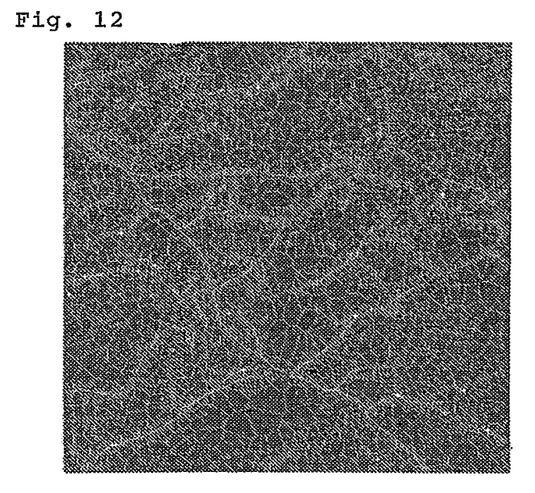
[FIG. 12] Voronoi diagram of the sample obtained in Comparative Example 1.
Figure 13:
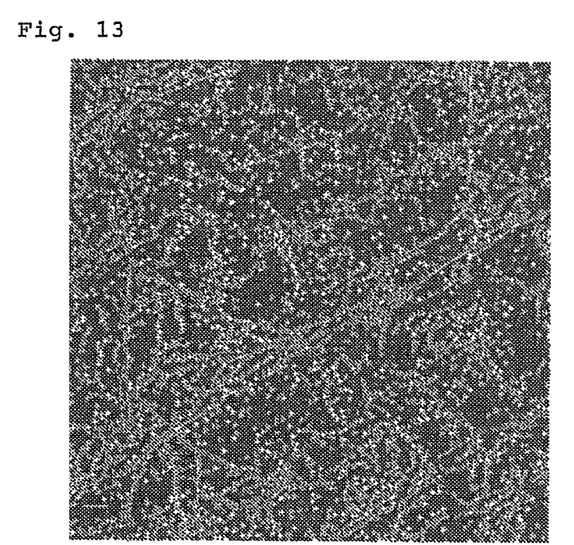
[FIG. 13] Etch-pit image (Etch-pit observation image) of the sample obtained in Example 2.
Figure 14:
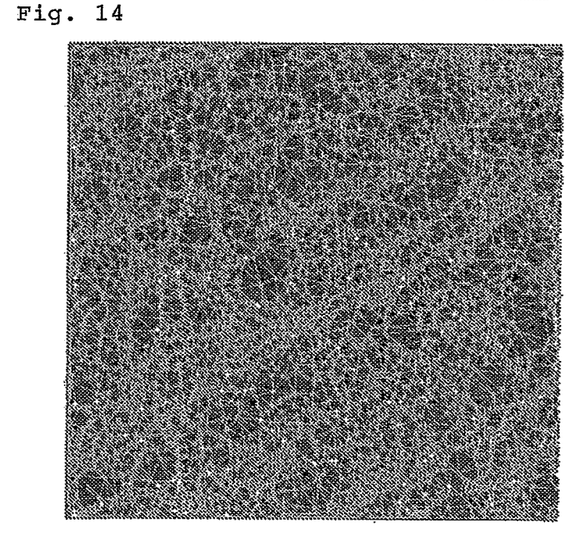
[FIG. 14] Delaunay diagram of the sample obtained in Example 2.
Figure 15:
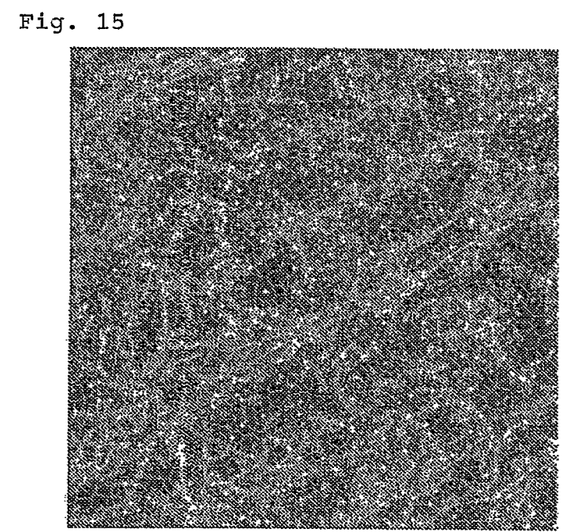
[FIG. 15] Voronoi diagram of the sample obtained in Example 2.
Figure 16:
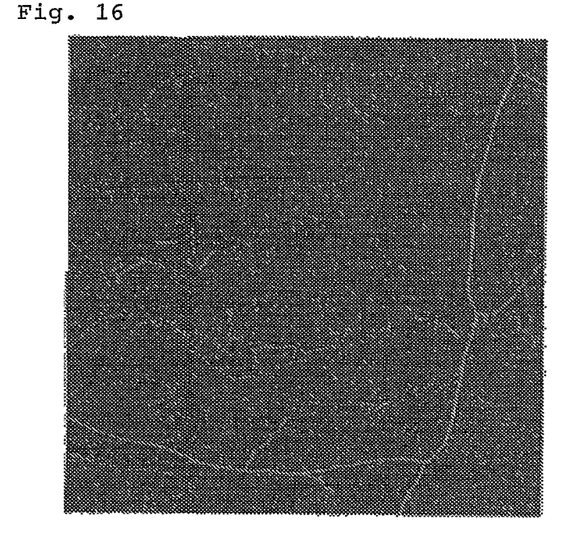
[FIG. 16] Etch-pit image (Etch-pit observation image) of the sample obtained in Comparative Example 2.
Figure 17:
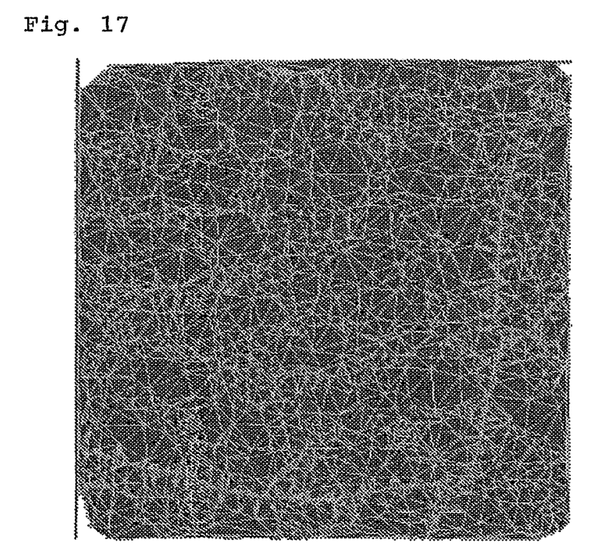
[FIG. 17] Delaunay diagram of the sample obtained in Comparative Example 2.
Figure 18:
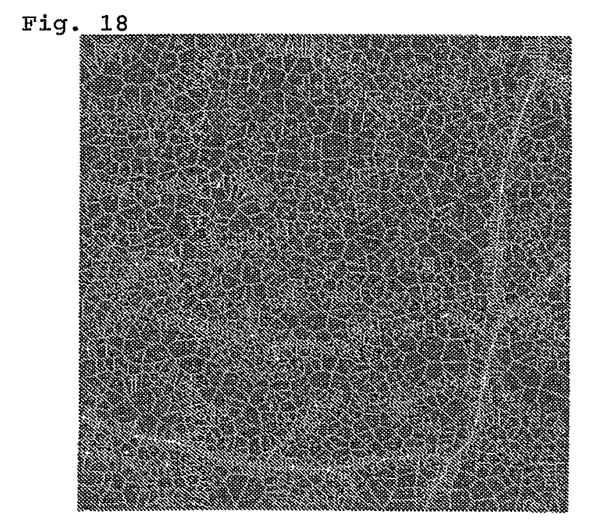
[FIG. 18] Voronoi diagram of the sample obtained in Comparative Example 2.

For the samples of examples and comparative examples, the relationship between the γ-ray-induced color center absorption intensity in the fluorite crystal (alternative evaluation parameter to laser durability) and the standard deviation of the Voronoi surface area or the standard deviation of the Delaunay distance, are shown in FIG. 3 as well as FIG. 4, respectively.

Example 1

A $CaF_2$ crystal ingot grown by the Bridgman-Stockbarger method (BS method) was cut out in the <111> direction, processed into a disk shape with a size of approximately 80 mm diameter and approximately 30 mm thickness to obtain an as-grown crystal substrate.

In the following examples and comparative examples, the respective crystal substrates were collected from equivalent sites of an identical crystal ingot.

The crystal substrate obtained in this way was heat-treated using a heat-treatment oven with a constitution shown in FIG. 1 and subsequently cooled. Likewise for the following comparative examples.

In so doing, a ground powder of $CaF_2$ crystal (particle size distribution: 10 μm to 10 mm) serving as a fluoride gas-adsorbing material was filled between the compartment-walled vessel 6 and the support vessel 4 so as to surround the entire periphery of the compartment-walled vessel 6 to form a 20 mm-thick fluoride gas trap layer 5.

In addition, as shown in FIG. 1, a $PbF_2$ powder was placed inside the annealing case 3 as a scavenger or a fluorinated agent.

The profile of the heat-treatment step was as follows.

First, at room temperature, the interior of the heat-treatment oven was reduced in pressure to have a vacuum atmosphere, then, the atmosphere inside the oven was rapidly substituted to Ar gas atmosphere, and the pressure inside the oven was set to 1 atmosphere.

Thereafter, the temperature was raised up to the highest temperature of 1,100° C. with a temperature rise time of 36 hours with a heater, and then the temperature was maintained for 24 hours. Thereafter, cooling to room temperature took 10 days.

From the crystal substrate obtained by heat-treating in this way, a specimen (sample) for etch-pit observation was cut-out and cleaved in the (111) plane in order to obtain a clean surface for observation surface use.

In addition, a sample for the purpose of evaluating laser durability was cut-out and optical polishing was performed on both (111) plane end surfaces.

Example 2

A specimen (sample) was obtained in a similar manner to Example 1, except that, in the profile of the heat-treatment step of Example 1, the temperature was raised up to the highest temperature of 1,000° C. with a temperature rise time of 36 hours, and then the temperature was maintained for 24 hours.

(Comparative Example 1)

A specimen (sample) was obtained in a similar manner to Example 1, except that no ground powder of $CaF_2$ crystal was filled in Example 1.

(Comparative Example 2)

A specimen (sample) was obtained in a similar manner to Example 2, except that no ground powder of $CaF_2$ crystal was filled in Example 2.

TABLE 1

| Specimen | Voronoi surface area standard deviation (μm$^2$) | Delaunay distance standard deviation (μm) | $^{60}$Co-γ-ray-induced color center absorption intensity (×10$^{-7}$) |
|---|---|---|---|
| Example 1 | 4312 | 66.7 | 2.45 |
| Example 2 | 1853 | 39.9 | 1.59 |
| Comparative Example 1 | 6205 | 82.0 | 5.59 |
| Comparative Example 2 | 8003 | 92.7 | 6.13 |

Example 3

A specimen (sample) was obtained in a similar manner to Example 1, except that a mixture from a ground powder of $CaF_2$ crystal (particle size distribution: 10 μm to 10 mm) and a powder of lead fluoride (particle size: approximately 50 μm) mixed at a mass proportion of 99:1 was filled between the compartment-walled vessel 6 and the support vessel 4 so as to surround the entire periphery of the compartment-walled vessel 6 to form a 20 mm-thick fluoride gas trap layer 5.

Examples 4 to 8

Specimens (samples) were obtained in a similar manner to Example 1, except that, in the profile of the heat-treatment step of Example 1, the temperature was raised up to the highest temperatures of 950 to 1,200° C. with temperature rise times of 30 to 36 hours, and then the temperature was maintained for 24 hours.

(Comparative Examples 3 to 5)

Specimens (samples) were obtained in a similar manner to Comparative Example 1, except that, in the profile of the heat-treatment step of Comparative Example 1, the temperature was raised up to the highest temperatures of 950 to 1,200° C. with temperature rise times of 30 to 36 hours, and then the temperature was maintained for 24 hours.

(Discussion)

When heat-treating a $CaF_2$ crystal grown similarly to prior art, if the cases where heat-treatment was conducted by providing a fluoride gas trap layer through compartment walls in the periphery of the fluorite crystal (Examples) are compared to the cases where heat-treatment was conducted without providing a fluoride gas trap layer (Comparative Examples), they differ greatly regarding both the standard deviation of the Voronoi surface areas and the standard deviation of the Delaunay distances as shown in FIG. 3 and FIG. 4, and fluorite crystals having excellent laser durability were found to be obtained in the cases where heat-treatment was conducted by providing a fluoride gas trap layer.

In addition, focusing on the standard deviation of the Voronoi surface areas (FIG. 3), in the cases where heat-treatment was conducted by providing a fluoride gas trap layer through compartment walls in the periphery of the fluorite crystal (Examples), it was found that the standard deviations of the Voronoi surface areas were 6,000 μm$^2$ or less and the color center absorption intensity (alternative evaluation parameter to laser durability) increased noticeably. From such points of view, it can be considered that for the standard deviation of the Voronoi surface areas of the present fluorite to be 6,000 μm$^2$ or less is desirable, and in particular to be 4,000 μm$^2$ or less, of which in particular 3,000 μm$^2$ or less is all the more desirable.

Meanwhile, focusing on the standard deviation of the Delaunay distance (FIG. 4), in the cases where heat-treatment was conducted by providing a fluoride gas trap layer through compartment walls in the periphery of the fluorite crystal (Examples), it was found that the standard deviations of the Delaunay distances were 80 μm or less and the color center absorption intensity (alternative evaluation parameter to laser durability) increased noticeably. From such points of view, it can be considered that for the standard deviation of the Voronoi surface areas of the present fluorite to be 80 μm or less is desirable, and in particular to be 60 μm or less, of which in particular 50 μm or less is all the more desirable.

The invention claimed is:

1. A fluorite, wherein the standard deviation of the surface areas of the Voronoi regions in a diagram from a Voronoi decomposition of the distribution of etch-pits in the (111) plane is 6,000 μm$^2$ or less.

2. A fluorite, wherein the standard deviation of the distances of the Delaunay edges in a diagram from a Delaunay decomposition of the distribution of etch-pits of the (111) plane is 80 μm or less.

* * * * *